US012596921B2

(12) United States Patent
Narayanan et al.

(10) Patent No.: US 12,596,921 B2
(45) Date of Patent: Apr. 7, 2026

(54) STOCHASTIC BITSTREAM GENERATION WITH IN-SITU FUNCTION MAPPING

(71) Applicant: International Business Machines Corporation, Armonk, NY (US)

(72) Inventors: Pritish Narayanan, San Jose, CA (US); Geoffrey Burr, Cupertino, CA (US)

(73) Assignee: International Business Machines Corporation, Armonk, NY (US)

( * ) Notice: Subject to any disclaimer, the term of this patent is extended or adjusted under 35 U.S.C. 154(b) by 841 days.

(21) Appl. No.: 17/848,136

(22) Filed: Jun. 23, 2022

(65) Prior Publication Data

US 2023/0419093 A1     Dec. 28, 2023

(51) Int. Cl.
G06F 7/70 (2006.01)
G06F 7/58 (2006.01)
(Continued)

(52) U.S. Cl.
CPC ............. G06N 3/065 (2023.01); G06F 7/582 (2013.01); G06N 3/048 (2023.01); H03M 1/66 (2013.01)

(58) Field of Classification Search
None
See application file for complete search history.

(56) References Cited

U.S. PATENT DOCUMENTS 6,816,100 B1 * 11/2004 Galton ................ H03M 1/0682
341/143
8,384,578 B2     2/2013 Verbruggen et al.
(Continued)

FOREIGN PATENT DOCUMENTS

WO     2023/248049 A1     12/2023

OTHER PUBLICATIONS

Oh, Sangheon, et al. "Energy-efficient Mott activation neuron for full-hardware implementation of neural networks." Nature nanotechnology 16.6 (2021): 680-687. (Year: 2021).*
(Continued)

*Primary Examiner* — Polina G Peach
(74) *Attorney, Agent, or Firm* — Gavin Giraud

(57) ABSTRACT

Techniques for generating digital outputs as stochastic bitstreams with activation function mapping are provided. In one aspect, a system includes: a shared circuitry component including a RNG for generating a sequence of random addresses to read a random sequence of digital voltage references stored in a LUT, and a DAC for converting the random sequence of digital voltage references into random analog voltage references $V_L$; and a comparator(s) for comparing the random analog voltage references $V_L$ and input analog voltages $V_N$ in sequences of comparisons to produce sequences of digital pulses as stochastic bitstreams. A system having multiple comparators for simultaneously comparing each of the random analog voltage references $V_L$ against more than one of the input analog voltages $V_N$ in parallel is also provided, as is a method for generating digital outputs from input analog voltages $V_N$.

15 Claims, 9 Drawing Sheets

(51) Int. Cl.
    *G06N 3/048*         (2023.01)
    *G06N 3/065*         (2023.01)
    *H03M 1/66*         (2006.01)

(56) References Cited

U.S. PATENT DOCUMENTS

| | | | | |
|---|---|---|---|---|
| 8,810,443 | B2 * | 8/2014 | Steensgaard-Madsen | ................... H03M 1/0668 341/172 |
| 10,063,255 | B2 | 8/2018 | Riedel et al. | |
| 10,078,800 | B2 | 9/2018 | Suri et al. | |
| 10,891,536 | B1 | 1/2021 | Merkel | |
| 10,996,929 | B2 | 5/2021 | Najafi et al. | |
| 11,018,689 | B2 | 5/2021 | Mohajer et al. | |
| 11,038,520 | B1 | 6/2021 | Narayanan et al. | |
| 11,119,732 | B2 | 9/2021 | Zhang et al. | |
| 11,146,282 | B1 | 10/2021 | Lok et al. | |
| 11,275,563 | B2 * | 3/2022 | Najafi | ..................... G06F 7/582 |
| 11,443,176 | B2 * | 9/2022 | Rasch | ..................... G06N 3/045 |
| 11,586,888 | B2 * | 2/2023 | Kataeva | ................. G06N 3/065 |
| 11,625,588 | B2 * | 4/2023 | Hou | ...................... G11C 13/004 706/41 |
| 2008/0278359 | A1 * | 11/2008 | Wojewoda | .......... H03M 1/1028 341/141 |
| 2009/0174588 | A1 * | 7/2009 | Muenter | ............... H03M 1/007 341/155 |
| 2011/0096878 | A1 * | 4/2011 | Mattisson | ............. H03M 3/422 375/350 |
| 2012/0262614 | A1 * | 10/2012 | Deng | .................. H03M 1/0641 341/158 |
| 2017/0220924 | A1 * | 8/2017 | Danjo | ...................... G06N 7/01 |
| 2018/0097535 | A1 | 4/2018 | Gordon et al. | |
| 2019/0149166 | A1 * | 5/2019 | Mohajer | ........... H03M 13/2903 341/118 |
| 2019/0289345 | A1 * | 9/2019 | Najafi | ..................... G06F 7/584 |
| 2020/0162085 | A1 | 5/2020 | Chung | |
| 2021/0143834 | A1 * | 5/2021 | Kvatinsky | ........... H03M 1/1033 |
| 2021/0256362 | A1 * | 8/2021 | Lie | ......................... G06N 3/047 |
| 2021/0365764 | A1 | 11/2021 | Eyole et al. | |
| 2021/0389931 | A1 | 12/2021 | Asadi et al. | |
| 2022/0140835 | A1 * | 5/2022 | Fredriksson | ............ H03M 3/02 341/155 |
| 2022/0395217 | A1 * | 12/2022 | Friedman | ............. A61B 5/0006 |
| 2023/0079289 | A1 * | 3/2023 | Rossello Sanz | ....... G06N 3/047 706/26 |

OTHER PUBLICATIONS

Li, Can, et al. "Efficient and self-adaptive in-situ learning in multilayer memristor neural networks." Nature communications 9.1 (2018): 2385 (Year: 2018).*

Shafiee, Ali, et al. "ISAAC: A convolutional neural network accelerator with in-situ analog arithmetic in crossbars." ACM SIGARCH Computer Architecture News 44.3 (2016): 14-26. (Year: 2016) (Year: 2016).*

International Search Report and Written Opinion for PCT/IB2023/ 056023 dated Sep. 11, 2023 (13 pages).

Giordano et al., "Analog-to-Digital Conversion with Reconfigurable Function Mapping for Neural Networks Activation Function Acceleration," IEEE Journal on Emerging and Selected Topics in Circuits and Systems, vol. 9, No. 2, pp. 367-376.

Lee et al., "Analog To Stochastic Bit Stream Converter Utilizing Voltage-Assisted Spin Hall Effect," IEEE Electron Device Letters, vol. 38, Issue 9 (Sep. 2017) (4 total pages).

Duarte et al., "XtokaxtikoX: A Stochastic Computing-Based Autonomous Cyber-Physical System," 2016 IEEE International Conference on Rebooting Computing (ICRC), Oct. 17-10, 2016 (7 total pages).

Jia et al., "SPINBIS: Spintronics Based Bayesian Inference System With Stochastic Computing," TCAD IEEE Transactions on Computer-Aided Design of Integrated Circuits and Systems, vol. 39, Issue 4, Apr. 2020 (14 total pages).

Pervaiz et al., "Probabilistic Computing with Binary Stochastic Neurons," 2019 IEEE BiCMOS and Compound semiconductor Integrated Circuits and Technology Symposium (BCICTS), Nov. 3-6, 2019 (7 total pages).

Li et al., "HEIF: Highly Efficient Stochastic Computing-Based Inference Framework for Deep Neural Networks," IEEE Transactions on Computer-Aided Design of Integrated Circuits and Systems, vol. 38, No. 8, pp. 1543-1556, Aug. 2019.

Mell et al., "The NIST Definition of Cloud Computing," NIST Special Publication 800-145, Sep. 2011 (7 pages).

* cited by examiner

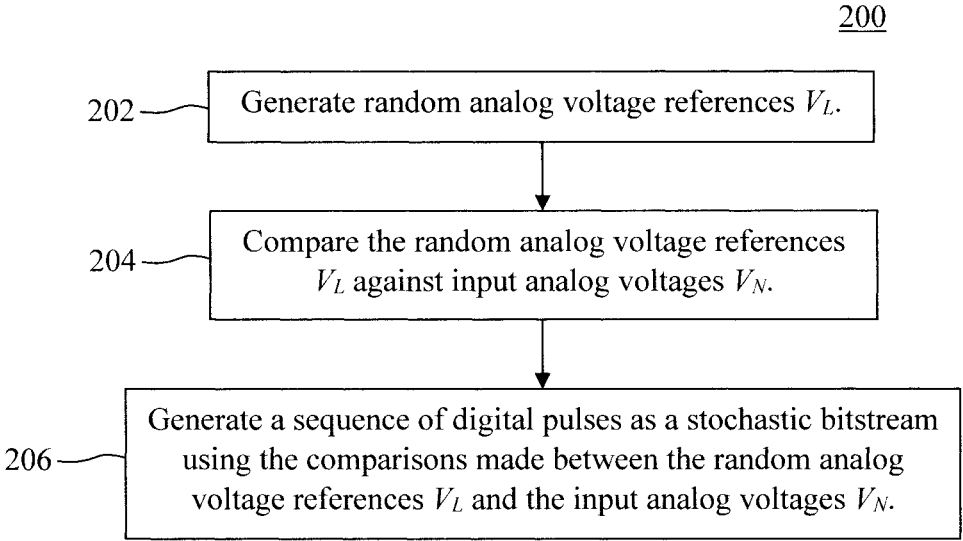

200

202 — Generate random analog voltage references $V_L$.

204 — Compare the random analog voltage references $V_L$ against input analog voltages $V_N$.

206 — Generate a sequence of digital pulses as a stochastic bitstream using the comparisons made between the random analog voltage references $V_L$ and the input analog voltages $V_N$.

FIG. 2

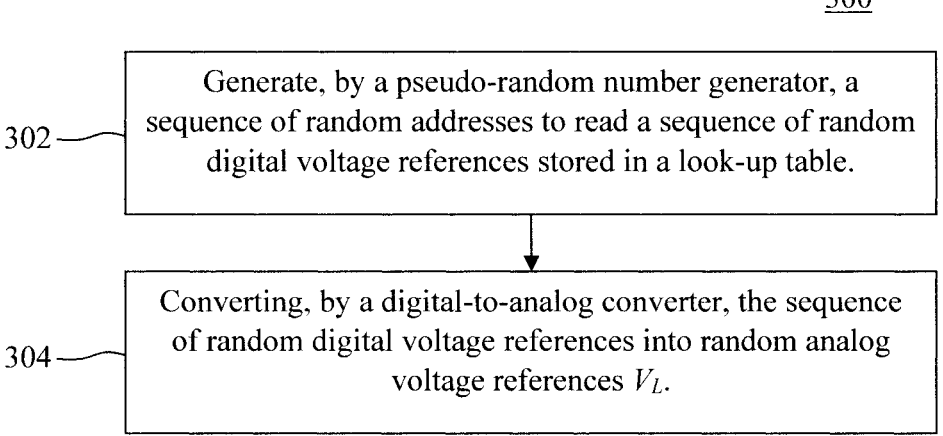

300

302 — Generate, by a pseudo-random number generator, a sequence of random addresses to read a sequence of random digital voltage references stored in a look-up table.

304 — Converting, by a digital-to-analog converter, the sequence of random digital voltage references into random analog voltage references $V_L$.

FIG. 3

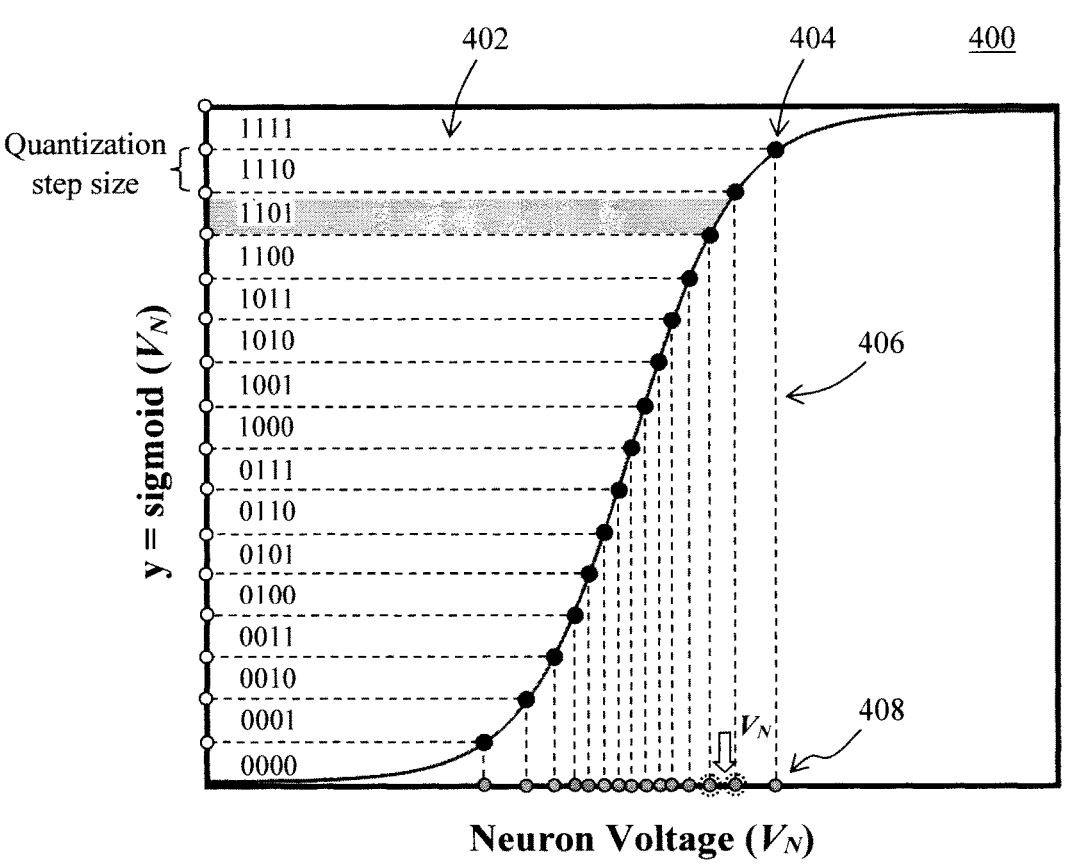

Neuron Voltage ($V_N$)

| 502 | Divide activation function into equally-spaced quantization levels. |

| 504 | Determine projections from corresponding points along the activation function to select input analog voltages $V_N$ along the x-axis. |

| 506 | Store a digital representation of the select input analog voltages $V_N$ in look-up table as a digital voltage reference. |

| 508 | Select another activation function. |

STOCHASTIC BITSTREAM GENERATION WITH IN-SITU FUNCTION MAPPING

FIELD OF THE INVENTION

The present invention relates to analog artificial intelligence (AI), and more particularly, to techniques for generating digital outputs represented as stochastic bitstreams from analog AI inputs with non-linear activation function mapping all done in-situ.

BACKGROUND OF THE INVENTION

With analog artificial intelligence (AI), the weights of a neural network are encoded directly onto a chip using memory devices that have the ability to store synaptic weights in their analog conductance state. Analog AL chips are highly efficient since computations are performed in the same place where the data is stored, thus overcoming the von Neumann bottleneck. Further, when the memory devices are arranged in a crossbar configuration with rows and columns, analog matrix-vector multiply-accumulate operations can be performed in parallel across an entire matrix of the stored weights.

In a formulation where the accumulated sum is stored as an analog voltage on each column, there is a need to implement further neural network operations such as non-linear activation functions such as rectified linear activation (ReLU), sigmoid and/or tan h functions. One approach is to convert the analog voltage into a digital quantity using an Analog-to-Digital Converter (ADC) followed by the use of standard digital circuits to calculate the various quantities. However, while this approach provides flexibility and precision, it also introduces significant overhead in terms of area and energy consumption of the additional on-chip circuitry.

SUMMARY OF THE INVENTION

The present invention provides techniques for generating digital outputs represented as stochastic bitstreams from analog artificial intelligence (AI) inputs with non-linear activation function mapping all done in-situ. Advantageously, the present techniques provide area and energy savings which is a concern especially in resource-constrained environments. In one aspect of the invention, a system for generating digital outputs from input analog voltages $V_N$ is provided. The system includes: a shared circuitry component including a pseudo-random number generator for generating a sequence of random addresses to read a random sequence of digital voltage references stored in a look-up table, and a digital-to-analog converter for converting the random sequence of digital voltage references into random analog voltage references $V_L$; and at least one comparator for comparing the random analog voltage references $V_L$ and the input analog voltages $V_N$ in sequences of comparisons, where each of the comparisons compares one of the random analog voltage references $V_L$ against one of the input analog voltages $V_N$, and where the at least one comparator produces a digital pulse as either a digital 1 or a digital 0 for each of the comparisons such that the sequences of the comparisons result in sequences of digital pulses that form stochastic bitstreams as the digital outputs. Advantageously, the stochastic bitstream generated by the present system allows for the simplification of any subsequent multiplication/addition operations using AND and OR logic gates instead of full digital arithmetic circuitry.

By way of example only, the digital voltage references stored in the look-up table can be selected to represent an inverse of an in-situ mapped activation function. In that manner, the activation function being mapped can be changed simply by changing the digital voltage references stored in the look-up table.

In another aspect of the invention, another system for generating digital outputs from input analog voltages $V_N$ is provided. The system includes: a shared circuitry component including a pseudo-random number generator for generating a sequence of random addresses to read a random sequence of digital voltage references stored in a look-up table, and a digital-to-analog converter for converting the random sequence of digital voltage references into random analog voltage references $V_L$; and multiple comparators for simultaneously comparing each of the random analog voltage references $V_L$ against more than one of the input analog voltages $V_N$ in sequences of comparisons performed in parallel for each of the input analog voltages $V_N$, where each of the multiple comparators produces a digital pulse as either a digital 1 or a digital 0 for each of the comparisons such that the sequences of the comparisons performed in parallel for each of the input analog voltages $V_N$ result in sequences of digital pulses that form stochastic bitstreams as the digital outputs.

The use of a shared circuitry component and multiple comparators in the present system advantageously enables a single given analog voltage reference $V_L$ to be simultaneously compared against several (~100's) of input analog voltages $V_N$. For instance, the input analog voltages $V_N$ can include at least a first input analog voltage $V_{N'}$, a second input analog voltage $V_{N''}$ and a third input analog voltage $V_{N'''}$, and the multiple comparators can include at least a first comparator for comparing a given one of the random analog voltage references $V_L$ at a given time step against the first input analog voltage $V_{N'}$, a second comparator for comparing the given one of the random analog voltage references $V_L$ at the given time step against the second input analog voltage $V_{N''}$, and a third comparator for comparing the given one of the random analog voltage references $V_L$ at the given time step against the third input analog voltage $V_{N'''}$.

In yet another aspect of the invention, a method for generating digital outputs from input analog voltages $V_N$ is provided. The method includes: generating, by a pseudo-random number generator in a shared circuitry component, a sequence of random addresses to read a random sequence of digital voltage references stored in a look-up table; converting, by a digital-to-analog converter in the shared circuitry component, the random sequence of digital voltage references into random analog voltage references $V_L$; comparing, by at least one comparator, the random analog voltage references $V_L$ and the input analog voltages $V_N$ in sequences of comparisons, where each of the comparisons compares one of the random analog voltage references $V_L$ against one of the input analog voltages $V_N$; and producing, by the at least one comparator, a digital pulse as either a digital 1 or a digital 0 for each of the comparisons, such that the sequences of the comparisons result in sequences of digital pulses that form stochastic bitstreams as the digital outputs.

A more complete understanding of the present invention, as well as further features and advantages of the present invention, will be obtained by reference to the following detailed description and drawings.

BRIEF DESCRIPTION OF THE DRAWINGS

FIG. 2 is a diagram illustrating an exemplary methodology for generating digital outputs from at least one analog input according to an embodiment of the present invention;

FIG. 3 is a diagram illustrating an exemplary methodology for generating random analog voltage references $V_L$ according to an embodiment of the present invention;

FIG. 4 is a diagram illustrating in-situ mapping of an exemplary non-linear activation function according to an embodiment of the present invention;

FIG. 5 is a diagram illustrating an exemplary methodology for in-situ function mapping to select digital voltage references according to an embodiment of the present invention;

DETAILED DESCRIPTION OF PREFERRED EMBODIMENTS

Figure 1:
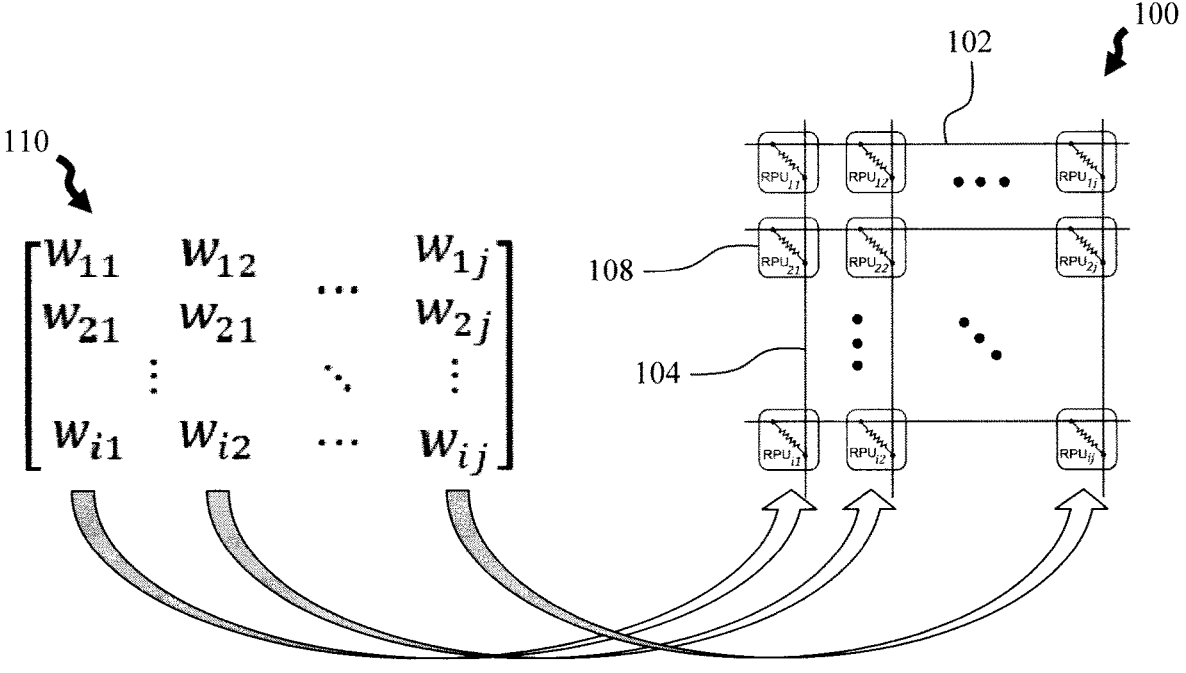
FIG. 1 is a diagram illustrating an analog AI crossbar array of resistive processing unit (RPU) devices according to an embodiment of the present invention.

As provided above, the implementation of conventional Analog-to-Digital Converter (ADC) and downstream digital circuits in an analog artificial intelligence (AL) chip introduces significant overhead in terms of the area and energy consumption of the additional on-chip circuitry. Overall area and energy considerations are especially important in resource-constrained environments.

Advantageously, provided herein are techniques for converting analog input values to digital output values without the need for a conventional linear ADC architecture, thus realizing a significant area and energy savings. Namely, as will be described in detail below, a stochastic bitstream of digital pulses is instead generated by comparing multiple random analog voltage references $V_L$ against fixed input analog voltages $V_N$. By 'fixed' it is meant that, during the stochastic bitstream generation process, the random analog voltage references $V_L$ are changing, but the input analog voltages $V_N$ are not.

Normal digital representations use binary numbers such as 0001, 0010, and 1000 to represent numbers such as 1, 2, and 8, respectively. Usually, there is one unique binary representation for each number. However, there is another way of storing numbers called bitstreams, where 'stream' represents time. Thus, a bitstream is interpreted as a sequence of one (1) and zero (0) bits, with the number of ones (1's) in the sequence representing the magnitude of the number. For instance, by way of example only, in the bitstream 1,0,0,0,0,0,0,0,0,0,0,0,0,0,0,0 there is only a single (1) in a sequence of sixteen bits which represents a small number. By comparison, in the bitstream 1,0,1,1,0,1,1,0,0, 1,0,0,1,0,0,0 there are seven (1's) in a sequence of sixteen bits which represents a larger number. Further, it is notable that multiple, different bitstreams can represent the same number. If random processes are used to generate these bitstreams, then they become 'stochastic' bitstreams. Stochastic bitstreams advantageously can facilitate downstream computations as will be described in detail below.

According to an exemplary embodiment, the random analog voltage reference $V_L$ is compared against the fixed input analog voltage $V_N$, and a digital pulse is generated when the fixed input analog voltage $V_N$ is greater than the random analog voltage reference $V_L$. Since the stochastic bitstream is a sequence of 1's and 0's, a sequence of these comparisons is performed between the fixed input analog voltage $V_N$ and random analog voltage references $V_L$. Each comparison produces one digital 1 or 0. Namely, a digital 1 is produced in the sequence whenever the fixed input analog voltage $V_N$, is greater than a random analog voltage reference $V_L$ against which the fixed input analog voltage $V_N$ is being compared. Conversely, a digital 0 is produced in the sequence whenever the fixed input analog voltage $V_N$ is less than a random analog voltage reference $V_L$ against which the fixed input analog voltage $V_N$ is being compared.

In this manner, larger fixed input analog voltages $V_N$ generate more digital pulses, and smaller quantities generate fewer digital pulses. This mechanism creates a stochastic bitstream where information is encoded in the number of digital pulses generated. A notable advantage of generating these stochastic digital pulse streams (as opposed to a digital quantity to be stored in a register as in a conventional ADC architecture) is that any subsequent multiplication/addition operations can be simplified using AND and OR logic gates instead of full digital arithmetic circuitry.

As also will be described in detail below, activation function mapping can be employed in generating the random analog voltage references $V_L$ for the stochastic bitstream generation using, e.g., a non-linear activation function such as rectified linear activation (ReLU), sigmoid and/or tan h activation functions. Implementation of the activation function mapping and stochastic bitstream generation are all done in-situ, meaning that the different operations which would normally happen one after the other (e.g., digitization, then activation function mapping), are combined.

According to an exemplary embodiment, the present techniques are implemented in an analog AI chip having a crossbar array of nonvolatile resistive processing unit (RPU) memory devices that have the ability to store synaptic weights in their analog conductance state. See FIG. 1. FIG. 1 is a diagram illustrating an exemplary analog AI crossbar array 100 that can be implemented in accordance with the present techniques.

As shown in FIG. 1, analog AI crossbar array 100 has a series of conductive row wires 102 (rows) and a series of conductive column wires 104 (columns) oriented orthogonal to, and intersecting, the conductive row wires 102. The intersections of the conductive row wires 102 and column wires 104 are separated by RPU memory devices 108 forming the analog AI crossbar array 100 of the RPU devices 108. By way of non-limiting example only, each RPU memory device 108 can include a first terminal, a second terminal and an active region therebetween. A conductance state of the active region identifies a weight value of the respective RPU memory device 108, which can be updated/adjusted by the application of a signal to the first/second terminals. Further, three-terminal (or even more terminal) devices can serve effectively as two-terminal resistive memory devices by controlling the extra terminals.

Each RPU memory device 108 ($RPU_{ij}$) is uniquely identified based on its location in the $i^{th}$ row and $j^{th}$ column of the analog AI crossbar array 100. For instance, going from the top to bottom, and from the left to right of analog AI crossbar array 100, the RPU memory device 108 at the intersection of the first row wire 102 and the first column wire 104 is designated as RPU$_{11}$, the RPU memory device 108 at the intersection of the first row wire 102 and the second column wire 104 is designated as RPU$_{12}$, and so on.

As shown in FIG. 1, each weight parameter w$_{ij}$ of an algorithmic (abstract) weight matrix 110 is physically mapped on hardware to a single one of the RPU memory devices (RPU$_{ij}$) 108 in analog AI crossbar array 100. The mapping of the weight parameters in weight matrix 110 to the RPU memory devices 108 in analog AI crossbar array 100 follows the same convention as above. Namely, weight w$_{i1}$ of weight matrix 110 is mapped to RPU$_{i1}$ of analog AI crossbar array 100, weight w$_{i2}$ of weight matrix 110 is mapped to RPU$_{i2}$ of analog AI crossbar array 100, and so on.

According to an exemplary embodiment, the RPU memory devices 108 of analog AI crossbar array 100 function as the weighted connections between neurons in a neural network. Similar to the so-called 'plasticity' of synaptic neurotransmitter connections that carry messages between biological neurons, the connections in a neural network that carry electronic messages between simulated neurons are provided with numeric weights that correspond to the strength or weakness of a given connection. The weights can be adjusted and tuned based on experience, making neural networks adaptive to inputs and capable of learning. For example, a neural network for image processing is defined by a set of input neurons which may be activated by the pixels of an input image. After being weighted and transformed by a function determined by the network's designer, the activations of these input neurons are then passed to other downstream neurons, which are often referred to as 'hidden' neurons. This process is repeated until an output neuron is activated.

The resistance of the RPU memory devices 108 can be altered by controlling the voltages applied between the individual row wires 102 and column wires 104. Altering the resistance is how data is stored in the RPU memory devices 108 based, for example, on a high resistance state or a low resistance state. The resistance state of the RPU memory devices 108 can be read by applying a voltage and measuring the current that passes through the target RPU memory device 108. All of the operations involving weights are performed fully in parallel by the RPU memory devices 108.

Given the above overview, an exemplary methodology 200 for generating digital outputs from at least one analog input in accordance with the present techniques is now described by way of reference to FIG. 2. It is notable that, while the following description involves an embodiment where multiple input analog voltages V$_N$ are processed, the present techniques can be performed in the same manner described with only a few, or even a single V$_N$ as the analog input (i.e., where one unique stochastic bitstream is generated). In step 202, random analog voltage references V$_L$ are generated that will be used for making a series of comparisons to create a stochastic bitstream. According to an exemplary embodiment, the random analog voltage references V$_L$ are generated using a sub-circuit block of the present system that includes a pseudo-random number generator such as a Linear Feedback Shift Register (LFSR), a look-up table (LUT), and a digital-to-analog converter (DAC). Namely, referring briefly to methodology 300 for generating random analog voltage references V$_L$ illustrated in FIG. 3, in step 302 the pseudo-random number generator is used to generate a sequence of random addresses. Each of the random addresses reads a random location in the look-up table that contains a digital voltage reference (keyword). Thus, the sequence of random addresses generated by the pseudo-random number generator will read a random sequence of the digital voltage references (keywords) from the look-up table. In step 304, the DAC is then used to convert the random sequence of random digital voltage references (keywords) into the random analog voltage references V$_L$ that are compared. As will be described in detail below, in one exemplary embodiment, the digital voltage references (keywords) stored in the look-up table are selected using in-situ activation function mapping.

Referring back to methodology 200, in step 204 the random analog voltage references V$_L$ are compared with the fixed input analog voltages V$_N$. The fixed input analog voltages V$_N$ can generally represent any analog voltage including, but not limited to, analog output from multiply-accumulate operations performed on crossbar array 100 of FIG. 1. According to an exemplary embodiment, the random analog voltage references V$_L$ are compared with the fixed input analog voltages V$_N$ using analog comparators that produce a digital 1 or 0 as a result of the comparison. It may be the case that there is one analog comparator associated with one input analog voltage V$_N$ in each column or, alternatively, a circuit share configuration can be employed whereby one analog comparator is shared amongst multiple columns. In that case, at a time step 1 the (shared) comparator compares against a first input analog voltage V$_N$1, at a time step 2 the (shared) comparator compares against a second input analog voltage V$_N$2, and so on. Advantageously, with the present system a single given analog voltage reference V$_L$ can be simultaneously compared against several (~100's) of input analog voltages V$_N$. Therefore, the pseudo-random number generator, look-up table, and digital-to-analog converter circuit cost is shared/amortized across a large number of input analog voltages V$_N$. Namely, the analog voltage reference V$_L$ value generated at each time step (whereby a time step is determined by the pseudo-random number generator indexing into the look-up table) derived from shared circuitry can be simultaneously compared against a plurality of analog voltage V$_N$ inputs, thereby enabling the digital conversion of analog voltage V$_N$ inputs in parallel.

In step 206, the comparisons made between the random analog voltage references V$_L$ and the fixed input analog voltages V$_N$ in step 204 are used to generate digital 0/1 pulses. Namely, as highlighted above, each comparison produces one digital 1 or 0, where a digital 1 is produced if the fixed input analog voltage V$_N$ is greater than the random analog voltage reference V$_L$, and a digital 0 is produced if the fixed input analog voltage V$_N$ is less than the random analog voltage reference V$_L$. Performing a sequence of these comparisons results in a sequence of 0/1 digital pulses which form the present stochastic bitstream. To look at it another way, the stochastic bitstream is a sequence of 1 and 0 bits, each bit representing a digital pulse generated based on the comparison of one of the random analog voltage references V$_L$ and one of the fixed input analog voltages V$_N$. Thus, a sequence of the comparisons results in a sequence of digital pulses which is the stochastic bitstream.

As described in conjunction with the description of methodology 300 of FIG. 3 above, the random analog voltage references V$_L$ can be generated using a pseudo-random number generator to provide a sequence of random addresses that read a random sequence of digital voltage references (keywords) stored in a look-up table, and a digital-to-analog converter to convert the random sequence of random digital voltage references (keywords) into the random analog voltage references $V_L$ that are compared. According to an exemplary embodiment, in-situ activation function mapping is used to select the digital voltage references (keywords) stored in the look-up table. See FIG. 4 and FIG. 5.

Referring first to FIG. 4, the in-situ mapping of a non-linear activation function is shown in plot 400. The x-axis in plot 400 corresponds to the input analog voltages $V_N$, and the horizontal dashed lines 402 represent equally-spaced quantization levels on the y-axis (4-bits in this example). It is notable that the terms 'Neuron Voltage $V_N$,' 'input analog voltages $V_N$' and 'analog inputs' are being used interchangeably herein. The points 404 at the intersections of the dashed lines 402 with the non-linear activation function (a sigmoid function in this example) trace out an approximate representation of this non-linear activation function. The vertical dashed lines 406 are projections from the points 404 to the x-axis, and intersect with the x-axis at points 408, i.e., specific fixed input analog voltage $V_N$ values. The vertical dashed lines 406 define unequal length input voltage intervals. All values on the x-axis within a particular one of these input voltage intervals will share the same values on the y-axis. It is notable that the mapping of a sigmoid function in plot 400 is merely an example, and that any activation function(s) can be implemented in accordance with the present techniques, including non-linear activation function such as ReLU, sigmoid and/or tan h activation functions.

FIG. 5 is a diagram illustrating an exemplary methodology 500 that employs this function mapping process to select the digital voltage references (keywords) to store in the look-up table. In step 502, a given activation function is first quantized by dividing the activation function into equally-spaced quantization levels. By way of example only, such equally-spaced quantization levels are shown using the horizontal dashed lines 402 in plot 400 of FIG. 4. As described above, the horizontal dashed lines 402 in plot 400 intersect the non-linear activation function at corresponding points 404. According to an exemplary embodiment, the activation function is a non-linear activation function such as a ReLU, a sigmoid and/or a tan h activation function.

In step 504, projections from each of the points 404 along the non-linear activation function to a select input analog voltage $V_N$ along the x-axis are determined. These projections will specify the digital output for every analog voltage $V_N$. By way of example only, the projections to the x-axis are shown using the vertical dashed lines 406 in plot 400 of FIG. 4 which intersect the x-axis at points 408. Points 408 correspond to select input analog voltages $V_N$ along the x-axis. Intuitively, it can be seen that if a given input analog voltage $V_N$ value is large, most of the points 408 are smaller than that given input analog voltage $V_N$. In that case, when the random analog voltage reference $V_L$ versus input analog voltage $V_N$ comparisons are made, the resulting stochastic bitstream will contain more 1 bits. By comparison, if a given input analog voltage $V_N$ is small, most of the points 408 are larger than that given input analog voltage $V_N$. In that case, when the random analog voltage reference $V_L$ versus input analog voltage $V_N$ comparisons are made, the resulting stochastic bitstream will have fewer 1 bits.

In step 506, a digital representation of each of these select input analog voltages $V_N$ is then stored in the look-up table as the digital voltage references (keywords). Specifically, as described in detail below, the inverse function is used to determine the spacing of the values of the input analog voltage $V_N$ (on the x-axis of plot 400). Once obtained, these $V_N$ values are just numbers for which a standard digital representation can be created. As described above, each random address generated by the pseudo-random number generator then reads a random location in the look-up table that contains a digital voltage reference (keyword), i.e., a digital representation of a select input analog voltage $V_N$ at one of the points 408 along the x-axis in plot 400. The digital-to-analog converter is then used to convert the digital voltage reference into the random analog voltage references $V_L$ used in making the above-described comparison.

Based on this process, it can be seen that the digital voltage references (keywords) in the look-up table are selected to represent the inverse of the in-situ function mapping. Namely, the digital voltage references (keywords) represent the mathematical inverse of the activation function, i.e., to determine what values of the input analog voltage $V_N$ (on the x-axis of plot 400) will give equally spaced values of the activation function outputs (on the y-axis of plot 400). If the function is non-linear, then the spacing of the input analog voltages $V_N$ will (by definition) be unequal, as shown in plot 400. Thus, the function being mapped can be changed by changing the digital voltage references (keywords) stored in the look-up table. For instance, in step 508 another, different activation function can be selected, and steps 502-506 are repeated to determine digital voltage references (keywords) to store in the look-up table for that newly selected function.

Figure 6:
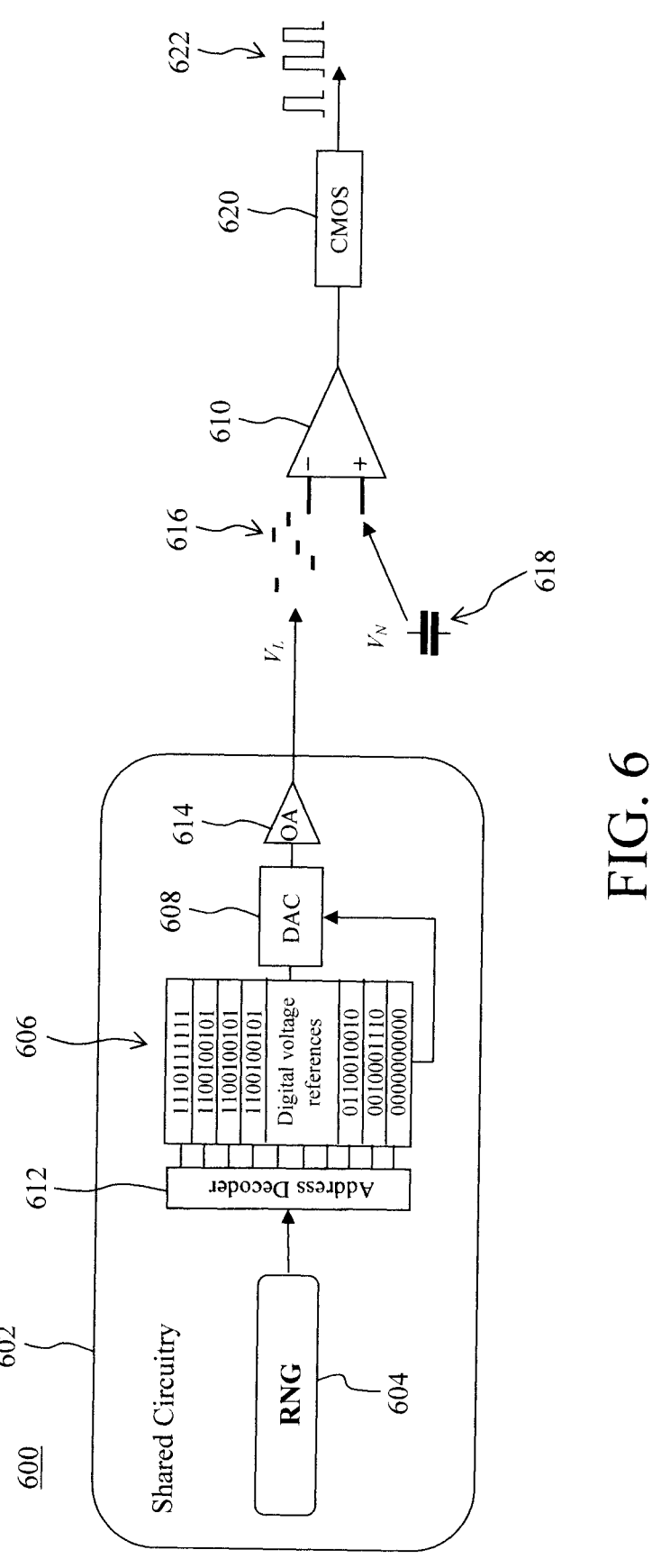
FIG. 6 is a diagram illustrating an exemplary system for generating digital outputs from at least one analog input according to an embodiment of the present invention.

FIG. 6 is a diagram illustrating an exemplary system 600 for generating digital outputs from at least one analog input. As will be apparent from the description that follows, system 600 can be implemented to perform one or more of the methodologies described herein. As shown in FIG. 6, system 600 includes a shared circuitry component 602 having a pseudo-random number generator (RNG) 604, a look-up table 606, a digital-to-analog converter (DAC) 608, and other associated devices for generating the random analog voltage references $V_L$, and a comparator 610 for comparing the random analog voltage references $V_L$ against fixed input analog voltages $V_N$. According to an exemplary embodiment, system 600 is controlled by a computer-based apparatus such as apparatus 900 described in conjunction with the description of FIG. 9, below.

Referring first to the shared circuitry component 602, as described in detail above, generation of the random analog voltage references $V_L$ begins with the pseudo-random number generator 604 generating a sequence of random addresses. According to an exemplary embodiment, the pseudo-random number generator 604 is a Linear Feedback Shift Register (LFSR). A Linear Feedback Shift Register is a shift register whose input bit is the output of a linear function of its previous states. As shown in FIG. 6, the look-up table 606 stores a plurality of the digital voltage references. An in-situ activation function mapping process for generating the digital voltage references was described, for example, in conjunction with the description of methodology 500 of FIG. 5, above.

An address decoder 612 is associated with the look-up table 606 and used to match each random address generated by pseudo-random number generator 604 with a row in the look-up table 606 containing a digital voltage reference. Once a random digital voltage reference is selected from the look-up table 606 by this process, digital-to-analog converter 608 converts the digital voltage reference into the random analog voltage references $V_L$. As shown in FIG. 6, the electrical signal from digital-to-analog converter 608 is amplified by an operational amplifier (OA) 614.

As described above, it is the random analog voltage references $V_L$ that is compared against fixed input analog voltages $V_N$ to generate the stochastic bitstream as a sequence of 0/1 digital pulses. The random analog voltage references $V_L$ output from the digital-to-analog converter 608/operational amplifier 614 are depicted in FIG. 6 using blocks 616, which serve as input to comparator 610. The other input to comparator 610 are the fixed input analog voltages $V_N$ which, as shown in FIG. 6, are stored by capacitors such as capacitor 618.

Comparator 610 compares the random analog voltage references $V_L$ to the fixed input analog voltages $V_N$ inputs. Output from these comparisons is used to generate the 0/1 digital pulses that make up the stochastic bitstream. As described in detail above, each comparison produces either a digital 1 pulse if the fixed input analog voltage $V_N$ is greater than the random analog voltage reference $V_L$, or a digital 0 pulse if the fixed input analog voltage $V_N$ is less than the random analog voltage reference $V_L$. A sequence of these comparisons produces a sequence of 0 bit and/or 1 bit digital pulses which form the present stochastic bitstream.

In analog AI, many distinct fixed input analog voltage $V_N$ values are produced as the output of several multiply accumulate operations. Advantageously, with the present system the shared circuitry component 602 can be employed to produce the random analog voltage references $V_L$ which can be compared simultaneously against many fixed input analog voltage $V_N$ values. More specifically, the digital conversion of a plurality of analog voltage $V_N$ inputs can be achieved in parallel where each analog voltage reference $V_L$ value in the random sequence of analog voltage reference $V_L$ produced by shared circuitry component 602 is compared in time by comparator 610 against multiple fixed input analog voltage $V_N$ values at each time step (as determined by the pseudo-random number generator 604 indexing into the look-up table 606).

Figure 7:
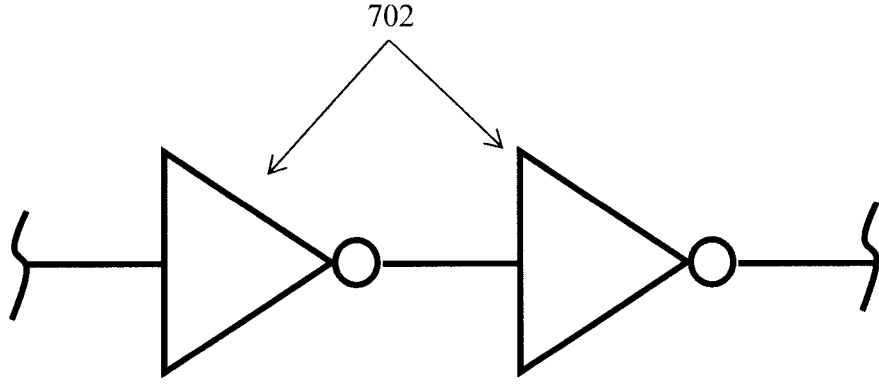
FIG. 7 is a diagram illustrating an exemplary output buffer that includes a pair of inverters connected in series according to an embodiment of the present invention.

As shown in FIG. 6, the output from comparator 610 is provided to a complementary metal oxide semiconductor (CMOS) digital logic circuit 620. According to an exemplary embodiment, CMOS digital logic circuit 620 includes an output buffer which converts the output of the comparator 610 into a logic signal. In one embodiment, the output buffer is configured as a pair of inverters (logic gates) 702 connected in series as shown in FIG. 7. The serially-connected inverters 702 are added to amplify the output signal from comparator 610.

Referring back to FIG. 6, comparator 610 produces random digital pulses, each digital pulse being either a 1 bit or a 0 bit. A sequence of these random digital pulses forms a stochastic bitstream 622. The stochastic bitstream 622 is the resulting digital output from system 600 which represents neuron activation. Advantageously, the stochastic bitstream 622 is amenable to multiplication/addition operations. Namely, any subsequent multiplication/addition operations can be performed by simple bit-wise operations performed on the stochastic bitstream 622 using AND and OR logic gates rather than the whole host of digital arithmetic circuitry used in conventional designs.

As provided above, the shared circuitry component 602, e.g., pseudo-random number generator 604, look-up table 606, and digital-to-analog converter 608, of the present system 600 enables the production of random analog voltage references $V_L$, each of which can be compared simultaneously against many fixed input analog voltage $V_N$ values such that the digital conversion of a plurality of analog voltage $V_N$ inputs can be achieved in parallel. This concept is further illustrated by way of reference to FIG. 8.

Figure 8:
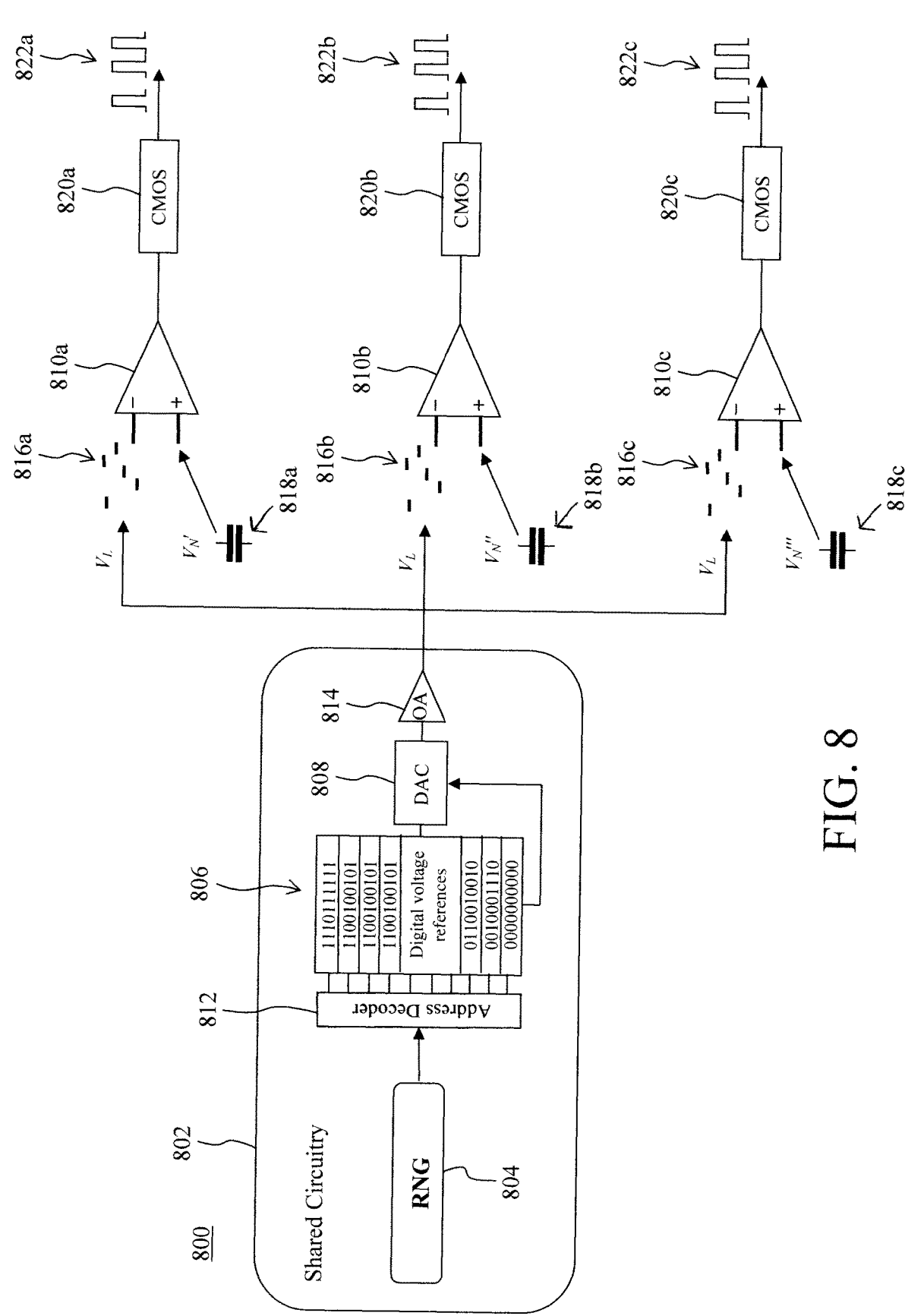
FIG. 8 is a diagram illustrating how the present system with shared circuitry produces random analog voltage references $V_L$ which can be compared simultaneously against many fixed input analog voltage $V_N$ values according to an embodiment of the present invention.

Referring to FIG. 8, a system 800 is shown for generating digital outputs from at least one analog input. According to an exemplary embodiment, system 800 is controlled by a computer-based apparatus such as apparatus 900 described in conjunction with the description of FIG. 9, below. As above, system 800 includes a shared circuitry component 802 having a pseudo-random number generator (RNG) 804, a look-up table 806, a digital-to-analog converter (DAC) 808, and other associated devices such as an address decoder 812 and operational amplifier 814, for generating the random analog voltage references $V_L$. The use of such shared circuitry to generate the random analog voltage references $V_L$ was described in detail above.

To enable parallel digital conversion across multiple fixed input analog voltage $V_N$ values, labeled here as $V_{N'}$, $V_{N''}$ and $V_{N'''}$, multiple comparators, i.e., 810a, 810b and 810c respectively, simultaneously receive as input the random analog voltage references $V_L$ from the shared circuitry component 802. At each time step, one of the random analog voltage reference $V_L$ values is compared by each of the comparators 810a, 810b and 810c against the fixed input analog voltage $V_{N'}$, $V_{N''}$ and $V_{N'''}$ values, respectively. As above, the fixed input analog voltage $V_{N'}$, $V_{N''}$ and $V_{N'''}$ values are stored by capacitors 818a, 818b and 818c, respectively. Output from these comparisons is used to generate the 0/1 digital pulses that make up the stochastic bitstream. As described in detail above, each comparison produces either a digital 1 pulse if the fixed input analog voltage $V_N$ is greater than the random analog voltage reference $V_L$, or a digital 0 pulse if the fixed input analog voltage $V_N$ is less than the random analog voltage reference $V_L$. A sequence of these comparisons performed in parallel for each of the input analog voltages $V_{N'}$, $V_{N''}$ and $V_{N'''}$ produces a sequence of 0 bit and/or 1 bit digital pulses which form the present stochastic bitstream.

The outputs from the comparators 810a, 810b and 810c are provided to corresponding complementary metal oxide semiconductor (CMOS) digital logic circuits 820a, 820b and 820c (e.g., an output buffer as described in conjunction with the description of FIG. 7, above). Comparators 810a, 810b and 810c produce random digital pulses, each digital pulse being either a 1 bit or a 0 bit. As shown in FIG. 8, sequences of these random digital pulses form stochastic bitstreams 822a, 822b and 822c, respectively, as the resulting digital output from system 800. For clarity, the terms 'first,' 'second,' 'third,' etc. may also be used herein when referring to each of the multiple comparators 810a, 810b and 810c, CMOS digital logic circuits 820a, 820b and 820c, and stochastic bitstreams 822a, 822b and 822c. Thus, as can be seen in FIG. 8, one unique stochastic bitstream 822a, 822b and 822c is generated for each input analog voltage $V_{N'}$, $V_{N''}$ and $V_{N'''}$.

As will be described below, one or more aspects of the present techniques can optionally be provided as a service in a cloud environment. For instance, by way of example only, the function mapping to select digital voltage references described in conjunction with the description of FIG. 5 above can instead be performed on a dedicated cloud server.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s).

In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 9:
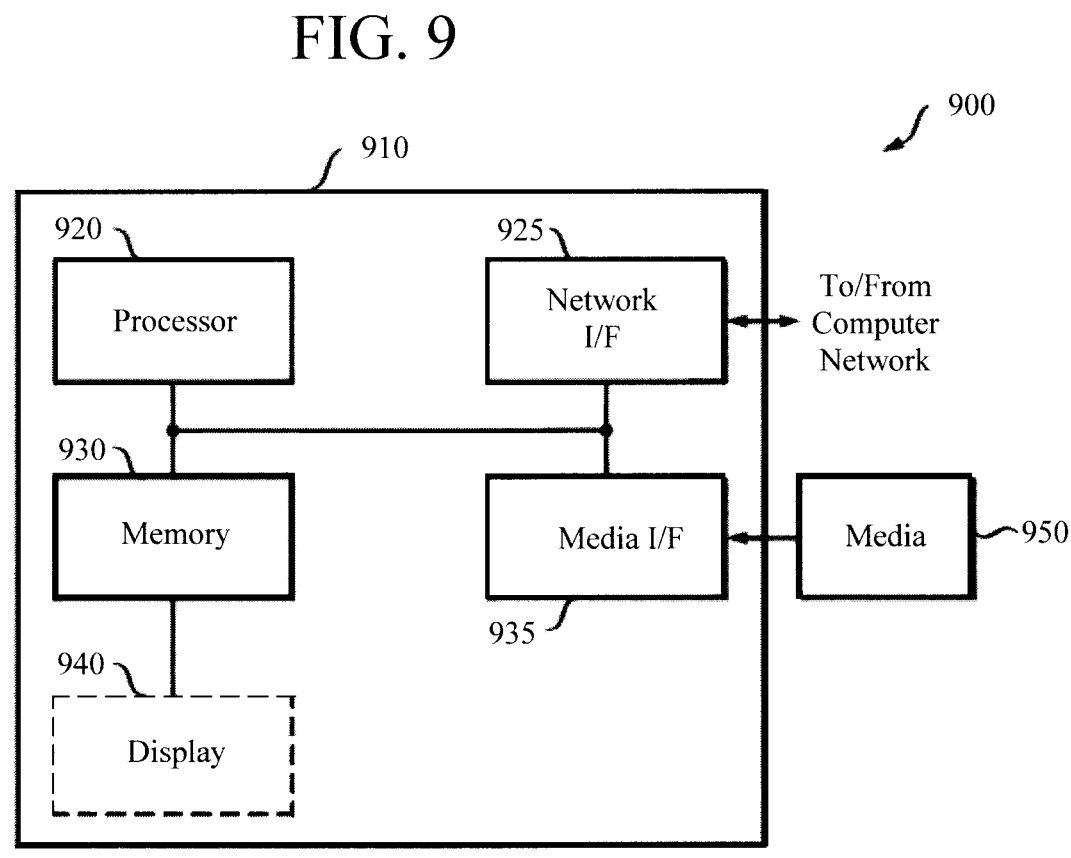
FIG. 9 is a diagram illustrating an exemplary apparatus for performing one or more of the methodologies presented herein according to an embodiment of the present invention.

Turning now to FIG. 9, a block diagram is shown of an apparatus 900. As provided above, apparatus 900 can be used to control system 600 and/or system 800 for generating digital outputs from at least one analog input. Thus, by way of example only, apparatus 900 can be configured to implement, via system 600 and/or system 800, one or more steps of methodology 200 of FIG. 2, one or more steps of methodology 300 of FIG. 3 and/or one or more steps of methodology 500 of FIG. 5 (including the in-situ function mapping to select digital voltage references).

Apparatus 900 includes a computer system 910 and removable media 950. Computer system 910 includes a processor device 920, a network interface 925, a memory 930, a media interface 935 and an optional display 940. Network interface 925 allows computer system 910 to connect to a network, while media interface 935 allows computer system 910 to interact with media, such as a hard drive or removable media 950.

Processor device 920 can be configured to implement the methods, steps, and functions disclosed herein. The memory 930 could be distributed or local and the processor device 920 could be distributed or singular. The memory 930 could be implemented as an electrical, magnetic or optical memory, or any combination of these or other types of storage devices.

Moreover, the term "memory" should be construed broadly enough to encompass any information able to be read from, or written to, an address in the addressable space accessed by processor device 920. With this definition, information on a network, accessible through network interface 925, is still within memory 930 because the processor device 920 can retrieve the information from the network. It should be noted that each distributed processor that makes up processor device 920 generally contains its own addressable memory space. It should also be noted that some or all of computer system 910 can be incorporated into an application-specific or general-use integrated circuit.

Optional display 940 is any type of display suitable for interacting with a human user of apparatus 900. Generally, display 940 is a computer monitor or other similar display.

Figure 10:
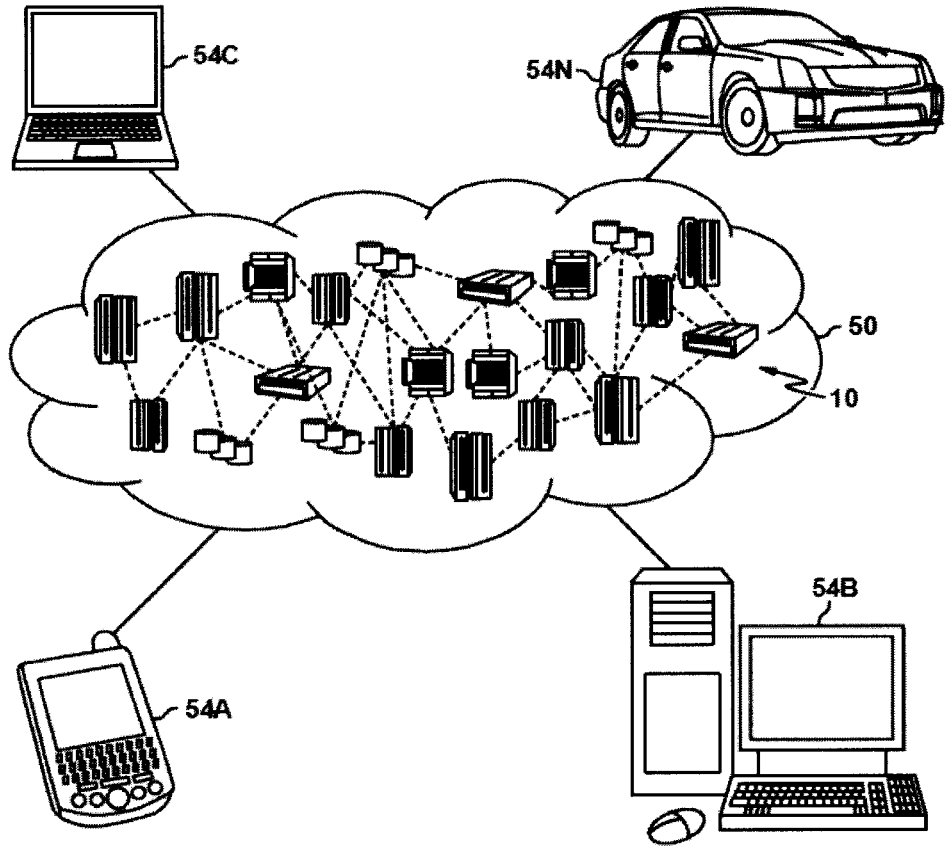
FIG. 10 depicts a cloud computing environment according to an embodiment of the present invention.
Figure 11:
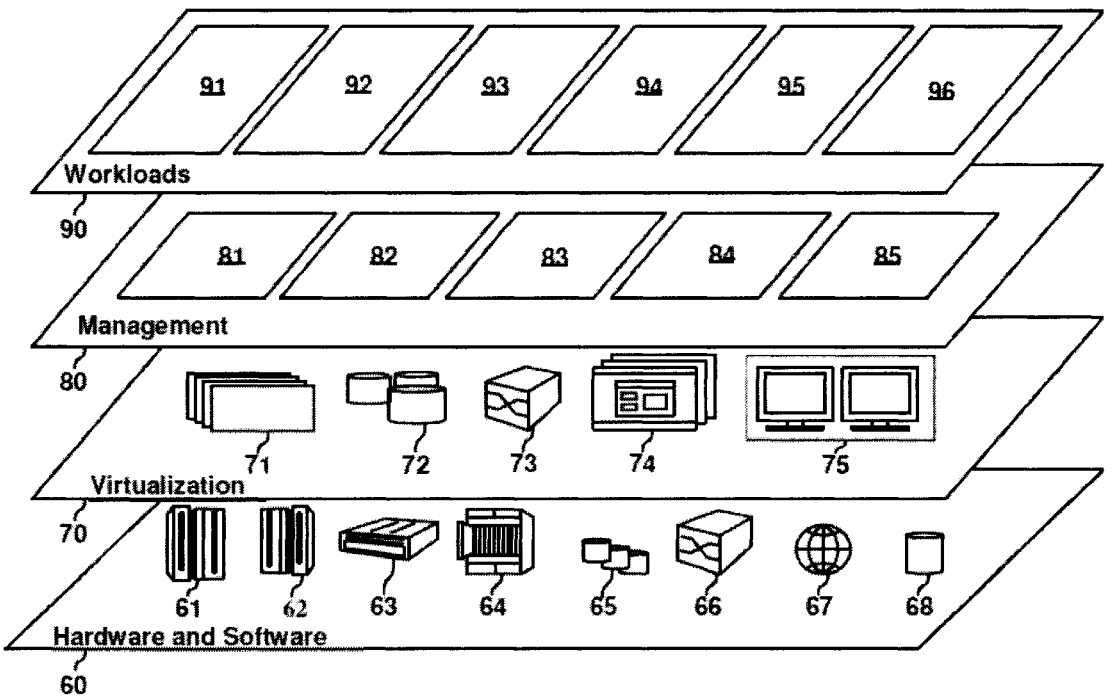
FIG. 11 depicts abstraction model layers according to an embodiment of the present invention.

Referring to FIG. 10 and FIG. 11, it is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Referring now to FIG. 10, illustrative cloud computing environment 50 is depicted. As shown, cloud computing environment 50 includes one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 10 are intended to be illustrative only and that computing nodes 10 and cloud computing environment 50 can communicate with any type of computerized device over any type of network and/or network addressable connection (e.g., using a web browser).

Referring now to FIG. 11, a set of functional abstraction layers provided by cloud computing environment 50 (FIG. 10) is shown. It should be understood in advance that the components, layers, and functions shown in FIG. 11 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and generating a digital output 96.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A system for generating digital outputs from input analog voltages $V_N$, the system comprising:
   a shared circuitry component comprising:
      a pseudo-random number generator for generating a sequence of random addresses to read a random sequence of digital voltage references selected to represent the inverse of an in-situ mapped activation function, wherein the random addresses are stored in a look-up table, and
      a digital-to-analog converter for converting the random sequence of digital voltage references into random analog voltage references $V_L$ that match each random address generated by the pseudo-random number generator with a row in the look-up table containing a digital voltage reference;
   an analog artificial intelligence (AI) crossbar array of nonvolatile resistive memory devices outputting the input analog voltages $V_N$ representing weighted connections between neurons in a neural network, wherein the input analog voltages $V_N$ comprise fixed input voltages for each time step of all the random analog voltage references $V_L$; and
   a plurality of comparators for simultaneously comparing each of the random analog voltage references $V_L$ and the input analog voltages $V_N$ in sequences of comparisons performed in parallel, wherein each of the comparisons compares one of the random analog voltage references $V_L$ against one of the input analog voltages $V_N$, and wherein each comparator produces a digital pulse as either a digital 1 or a digital 0 for each of the comparisons such that the sequences of the comparisons result in sequences of digital pulses that form stochastic bitstreams as the digital outputs that represent the neurons activations, and wherein one unique stochastic bitstream is generated for each of the input analog voltages $V_N$.

2. The system of claim 1, wherein the pseudo-random number generator comprises a Linear Feedback Shift Register.

3. The system of claim 1, wherein the activation function is a non-linear function selected from the group consisting of: a rectified linear activation (ReLU) function, a sigmoid function, and a tanh activation function.

4. A system for generating digital outputs from input analog voltages $V_N$, the system comprising:
   a shared circuitry component comprising:
      a pseudo-random number generator for generating a sequence of random addresses to read a random sequence of digital voltage references selected to represent the inverse of an in-situ mapped activation function, wherein the random addresses are stored in a look-up table, and
      a digital-to-analog converter for converting the random sequence of digital voltage references into random analog voltage references $V_L$ that match each random address generated by the pseudo-random number generator with a row in the look-up table containing a digital voltage reference;
   an analog artificial intelligence (AI) crossbar array of nonvolatile resistive memory devices outputting the input analog voltages $V_N$ representing weighted connections between neurons in a neural network, wherein the input analog voltages $V_N$ comprise fixed input voltages for each time step of all the random analog voltage references $V_L$; and multiple comparators for simultaneously comparing each of the random analog voltage references $V_L$ against more than one of the input analog voltages $V_N$ in sequences of comparisons performed in parallel for each of the input analog voltages $V_N$, wherein each of the comparisons compares one of the random analog voltage references $V_L$ against one of the input analog voltages $V_N$, wherein each of the multiple comparators produces a digital pulse as either a digital 1 or a digital 0 for each of the comparisons such that the sequences of the comparisons performed in parallel for each of the input analog voltages $V_N$ results in sequences of digital pulses that form stochastic bitstreams as the digital outputs that represent the neurons activations, and wherein one unique stochastic bitstream is generated for each of the input analog voltages $V_N$.

5. The system of claim 4, wherein the input analog voltages $V_N$ comprise at least a first input analog voltage $V_{N'}$, a second input analog voltage $V_{N''}$ and a third input analog voltage $VN_{...}$, and wherein the multiple comparators comprise at least a first comparator for comparing a given one of the random analog voltage references $V_L$ at a given time step against the first input analog voltage $V_{N'}$, a second comparator for comparing the given one of the random analog voltage references $V_L$ at the given time step against the second input analog voltage $V_{N''}$, and a third comparator for comparing the given one of the random analog voltage references $V_L$ at the given time step against the third input analog voltage $V_{N''''}$.

6. The system of claim 4, wherein the pseudo-random number generator comprises a Linear Feedback Shift Register.

7. The system of claim 4, wherein the activation function is a non-linear function selected from the group consisting of: a rectified linear activation (ReLU) function, a sigmoid function, and a tanh activation function.

8. A method for generating digital outputs from input analog voltages $V_N$, the method comprising:

generating, by a pseudo-random number generator in a shared circuitry component, a sequence of random addresses to read a random sequence of digital voltage references selected to represent the inverse of an in-situ mapped activation function, wherein the random addresses are stored in a look-up table;

converting, by a digital-to-analog converter in the shared circuitry component, the random sequence of digital voltage references into random analog voltage references $V_L$ that match each random address generated by the pseudo-random number generator with a row in the look-up table containing a digital voltage reference;

outputting, by an analog artificial intelligence (AI) cross-bar array of nonvolatile resistive memory devices, the input analog voltages $V_N$ representing weighted connections between neurons in a neural network, wherein the input analog voltages $V_N$ comprise fixed input voltages for each time step of all the random analog voltage references $V_L$;

simultaneously comparing, by multiple comparators, each of the random analog voltage references $V_L$ and the input analog voltages $V_N$ in sequences of comparisons performed in parallel, wherein each of the comparisons compares one of the random analog voltage references $V_L$ against one of the input analog voltages $V_N$; and producing, by the at least one comparator, a digital pulse as either a digital 1 or a digital 0 for each of the comparisons, such that the sequences of the comparisons result in sequences of digital pulses that form stochastic bitstreams as the digital outputs that represent the neurons activations, and wherein one unique stochastic bitstream is generated for each of the input analog voltages $V_N$.

9. The method of claim 8, wherein the pseudo-random number generator comprises a Linear Feedback Shift Register.

10. The method of claim 8, further comprising:

dividing the given activation function into equally-spaced quantization levels;

determining projections from corresponding points along the given activation function to select input analog voltages $V_N$; and storing digital representations of the select input analog voltages $V_N$ in the look-up table as the digital voltage references.

11. The method of claim 10, wherein the given activation function is a non-linear function selected from the group consisting of: a rectified linear activation (ReLU) function, a sigmoid function, and a tanh activation function.

12. The method of claim 10, further comprising:

selecting another activation function; and repeating the dividing, the determining and the storing with the another activation function.

13. The method of claim 8, wherein multiple comparators are used to simultaneously compare each of the random analog voltage references $V_L$ against more than one of the input analog voltages $V_N$.

14. The method of claim 13, wherein the input analog voltages $V_N$ comprise at least a first input analog voltage $V_{N'}$, a second input analog voltage $V_{N''}$ and a third input analog voltage $V_{N'''}$, and wherein the multiple comparators comprise at least a first comparator for comparing a given one of the random analog voltage references $V_L$ at a given time step against the first input analog voltage $V_{N'}$, a second comparator for comparing the given one of the random analog voltage references $V_L$ at the given time step against the second input analog voltage $V_{N''}$, and a third comparator for comparing the given one of the random analog voltage references $V_L$ at the given time step against the third input analog voltage $V_{N'41}$.

15. The system of claim 1, wherein each of the random analog voltage references $V_L$ is simultaneously compared against all of the input analog voltages $V_N$ at each time step.

* * * * *